United States Patent
Huo et al.

(10) Patent No.: US 7,982,256 B2
(45) Date of Patent: Jul. 19, 2011

(54) SEMICONDUCTOR MEMORY DEVICE HAVING DRAM CELL MODE AND NON-VOLATILE MEMORY CELL MODE AND OPERATION METHOD THEREOF

(75) Inventors: Zong-Liang Huo, Suwon-si (KR); In-Seok Yeo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1051 days.

(21) Appl. No.: 11/798,716

(22) Filed: May 16, 2007

(65) Prior Publication Data
US 2008/0048239 A1 Feb. 28, 2008

(30) Foreign Application Priority Data
Aug. 23, 2006 (KR) .................... 10-2006-0080097

(51) Int. Cl.
*H01L 29/788* (2006.01)
(52) U.S. Cl. ........ 257/315; 257/314; 257/324; 257/325; 257/E29.3; 257/E29.309
(58) Field of Classification Search .................. None
See application file for complete search history.

(56) References Cited

U.S. PATENT DOCUMENTS

| | | | |
|---|---|---|---|
| 5,286,994 A * | 2/1994 | Ozawa et al. ............... 257/411 |
| 5,389,567 A | 2/1995 | Acovic et al. |
| 5,999,444 A * | 12/1999 | Fujiwara et al. ......... 365/185.02 |
| 6,009,011 A | 12/1999 | Yamauchi |
| 6,137,718 A * | 10/2000 | Reisinger ................. 365/185.03 |
| 6,469,343 B1 * | 10/2002 | Miura et al. ................... 257/324 |
| 6,661,042 B2 * | 12/2003 | Hsu ............................... 257/239 |
| 6,952,366 B2 | 10/2005 | Forbes |
| 7,042,760 B2 | 5/2006 | Hwang et al. |
| 7,054,201 B2 * | 5/2006 | Ahn et al. ................. 365/185.28 |
| 7,352,024 B2 * | 4/2008 | Iwata et al. ................... 257/314 |
| 7,592,666 B2 * | 9/2009 | Noguchi et al. ............... 257/324 |

FOREIGN PATENT DOCUMENTS

| | | |
|---|---|---|
| JP | 10-189891 | 7/1998 |
| JP | 2004-134531 | 4/2004 |
| KR | 10-2004-0084288 A | 10/2004 |
| KR | 10-2005-0071307 A | 7/2005 |
| KR | 10-2006-0001876 | 1/2006 |
| WO | WO 2006/026159 A1 | 3/2006 |

* cited by examiner

*Primary Examiner* — Zandra Smith
*Assistant Examiner* — Khanh B Duong
(74) *Attorney, Agent, or Firm* — Lee & Morse, P.C.

(57) ABSTRACT

A semiconductor memory device may have a DRAM cell mode and a non-volatile memory cell mode without a capacitor, including multiple transistors arranged in an array and having floating bodies, word lines connected to gate electrodes of the transistors, bit lines at a first side of the gate electrodes connected to drains of the transistors, source lines at a second side of the gate electrodes, different from the first side, and connected to sources of the transistors on the semiconductor substrate, and charge storage regions between the gate electrodes and the floating bodies.

18 Claims, 9 Drawing Sheets

SEMICONDUCTOR MEMORY DEVICE HAVING DRAM CELL MODE AND NON-VOLATILE MEMORY CELL MODE AND OPERATION METHOD THEREOF

BACKGROUND OF THE INVENTION

1. Field of the Invention

The present invention relates to a semiconductor memory device and an operation method thereof. More particularly, the present invention pertains to a semiconductor memory device having a DRAM cell mode and a non-volatile memory cell mode, and an operation method thereof.

2. Description of Related Art

Semiconductor memory devices include non-volatile memory devices, e.g., a flash memory, and volatile memory devices, e.g., a dynamic random access memory (DRAM). The flash memory may maintain data stored in a memory cell even when power supply is turned off. However, since the flash memory may require a large time period to write or erase data, the flash memory may not be appropriate for frequent rewriting. The number of cycles of writing or erasing data in the non-volatile memory device may thus be limited.

The DRAM may not maintain data stored in a memory cell when the power supply is turned off. However, since the DRAM requires a short time to rewrite data, there is no limitation in the number of cycles of rewriting data.

Therefore, a semiconductor memory device capable of frequently rewriting data and maintaining the rewritten data for a long time has been desired. That is, a semiconductor memory device having both a non-volatile memory cell region and a DRAM cell region may be advantageous.

One type of semiconductor memory device may include a capacitor. Since the semiconductor memory device including the capacitor may require a region for the capacitor, there may be a limit in improving the integration density. In addition, since the semiconductor memory device including the capacitor may perform a program operation or an erase operation as a non-volatile memory device depending on whether the capacitor stores information or not, its operation method may be complicated.

SUMMARY OF THE INVENTION

The present invention is therefore directed to a semiconductor memory device having a DRAM cell mode and a non-volatile memory cell mode, without a capacitor, and a method of operating the semiconductor memory device which substantially overcome one or more of the problems due to the limitations and disadvantages of the related art.

At least one of the above and other features and advantages of the present invention may be realized by providing a semiconductor memory device which may include multiple transistors arranged in an array on a semiconductor substrate, the transistors having floating bodies, word lines connected to gate electrodes of the transistors, bit lines connected to drains of the transistors at a first side of the gate electrodes, source lines connected to sources of the transistors at a second side of the gate electrodes different from the first side of the gate electrodes, and charge storage regions between the gate electrodes and the floating bodies.

Each of the charge storage regions may include a dielectric layer. The dielectric layer may include a first silicon oxide layer, a silicon nitride layer on the first silicon oxide layer, and a second silicon oxide layer on the silicon nitride layer. The semiconductor memory device may further include gate insulating layers between the floating bodies and the gate electrodes, and a buried insulating layer on the semiconductor substrate, where each of the floating bodies may be electrically isolated by the gate insulating layer, the buried insulating layer, the source, and the drain. The semiconductor memory device may further include gate insulating layers between the floating bodies and the gate electrodes, a buried insulating layer on the semiconductor substrate, and an isolation layer surrounding sidewalls of the floating body, where each of the floating bodies may be electrically isolated by the gate insulating layer, the buried insulating layer, the isolation layer, the source, and the drain.

The source line may be connected to sources of adjacent transistors. The gate electrodes may be on the floating bodies, and the sources and drains may be at both sides of the floating bodies. Each of the floating bodies may include first and second floating bodies spaced apart from each other, the sources and drains may be respectively under and on the first and second floating bodies, and the gate electrodes may be between the first and second floating bodies. The gate electrodes may extend from their one ends to cross over the first and second floating bodies. The semiconductor memory device may further include back gate electrodes covering first sidewalls of the first and second floating bodies including first and second gate electrodes insulated from each other, where the first and second gate electrodes may be disposed to cover second sidewalls of the first and second floating bodies different from the first sidewalls.

Each transistor in the array may define a memory cell, and the device may further include a selection circuit adapted to select at least one cell of the memory cells, to determine whether the selected cell may operate in a DRAM cell mode or a non-volatile memory cell mode, and to operate the selected cell in the DRAM cell mode or the non-volatile memory cell mode in accordance with the determination. During operation of the selected cell in the DRAM cell mode, the selection circuit may be adapted to apply a gate voltage to a gate electrode of the selected cell, gate electrodes of memory cells sharing a word line with the selected cell, apply a drain voltage to a drain of the selected cell, drain electrodes of memory cells sharing a bit line with the selected cell, and apply a source voltage lower than the drain voltage to a source of the selected cell, sources of memory cells sharing a source line with the selected cell to accumulate holes in the floating bodies. The gate voltage may be about 5V, the drain voltage may be about 2V, and the source voltage may be about 0V. During operation of the selected cell in the DRAM cell mode, the selection circuit may be adapted to float a gate electrode of the selected cell, gate electrodes of memory cells sharing a word line with the selected cell, apply a negative drain voltage to a drain of the selected cell, drains of memory cells sharing a bit line with the selected cell, and apply a source voltage to a source of the selected cell, sources of memory cells sharing a source line with the selected cell to erase holes in the floating bodies. The negative drain voltage may be about −2V, and the source voltage may be about 0V. During operation of the selected cell in the non-volatile memory cell mode, the selection circuit may be adapted to apply a gate voltage to a gate electrode of the selected cell, gate electrodes of memory cells sharing a word line with the selected cell, apply a drain voltage to a drain of the selected cell, drains of memory cells sharing a bit line with the selected cell, and apply a source voltage lower than the drain voltage to a source of the selected cell, sources of memory cells sharing a source line with the selected cell to store charges in the charge storage regions. The gate voltage may be about 10V, the drain voltage may be about 5V, and the source voltage may be about 0V. During operation of the selected cell in the non-volatile memory cell mode, the selection circuit may be adapted to apply a negative gate voltage to a gate electrode of the selected cell, and gate electrodes of memory cells sharing a word line with the selected cell, float a drain of the selected cell, and drains of memory cells sharing a bit line with the selected cell, and apply a source voltage to a source of the selected cell, and sources of memory cells sharing a source line with the selected cell to erase charges in the charge storage regions. The negative gate voltage may be about −8V, and the source voltage may be about 0V.

At least one of the above and other features and advantages of the present invention may be realized by providing a method of operating a semiconductor memory device having memory cells arranged in an array, each of the memory cells including a semiconductor substrate, a floating body disposed on the semiconductor substrate, a gate electrode insulated from the floating body, a source and a drain disposed in the semiconductor substrate at both sides of the gate electrode, and a charge storage region interposed between the floating body and the gate electrode, the method including selecting at least one cell of memory cells, determining whether the selected sell is to operate in a DRAM cell mode or a non-volatile memory cell mode, and operating the selected cell in the DRAM cell mode or the non-volatile memory cell mode, after determining an operational mode.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
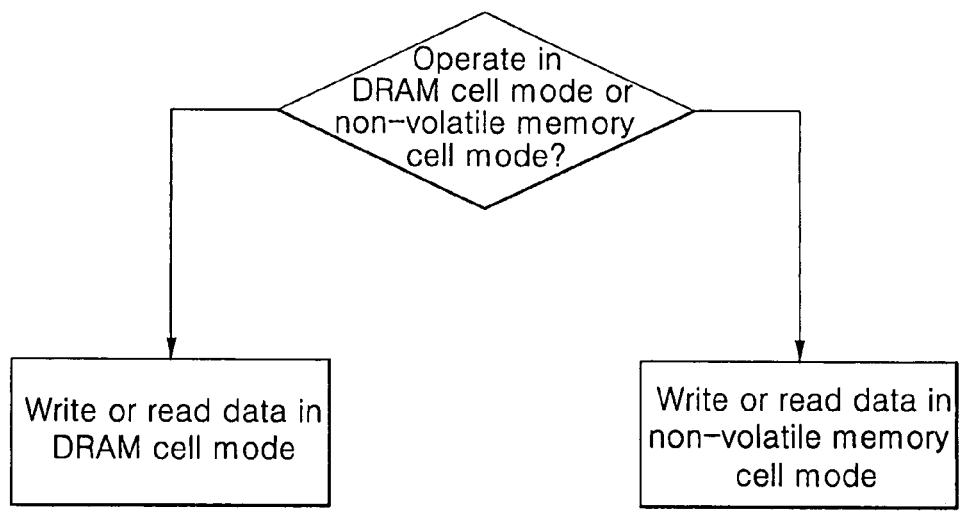
FIG. 1 illustrates a schematic flowchart of a method of operating a semiconductor memory device in accordance with the present invention.

Korean Patent Application 10-2006-0080097, filed on Aug. 23, 2006, in the Korean Intellectual Property Office, and entitled: "Semiconductor Memory Device Having Dram Cell Mode and Non-Volatile Memory Cell Mode and Operation Method Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Referring to FIGS. 1 to 7, a semiconductor memory device in accordance with an embodiment of the present invention may include a buried oxide layer 12 on a semiconductor substrate 10. The semiconductor substrate 10 may be, e.g., a silicon-on-insulator (SOI) substrate, a silicon-on-glass (SOG) substrate, etc. A floating body 14 may be on the buried oxide layer 12. A source region 16s and a drain region 16d may be at both sides of the floating body 14. The source region 16s and the drain region 16d may be impurity regions of a first conductivity type, and the floating body 14 may be an himpurity region of a second conductivity type different from the first conductivity type.

Figure 3:
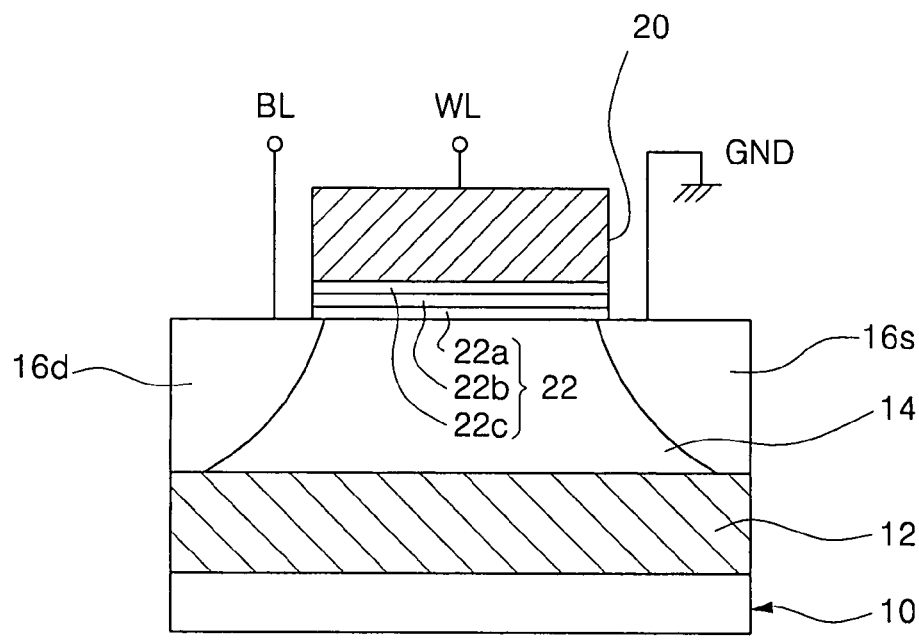
FIG. 3 illustrates a cross-sectional view of a semiconductor memory device in accordance with an exemplary embodiment of the present invention.
Figure 4:
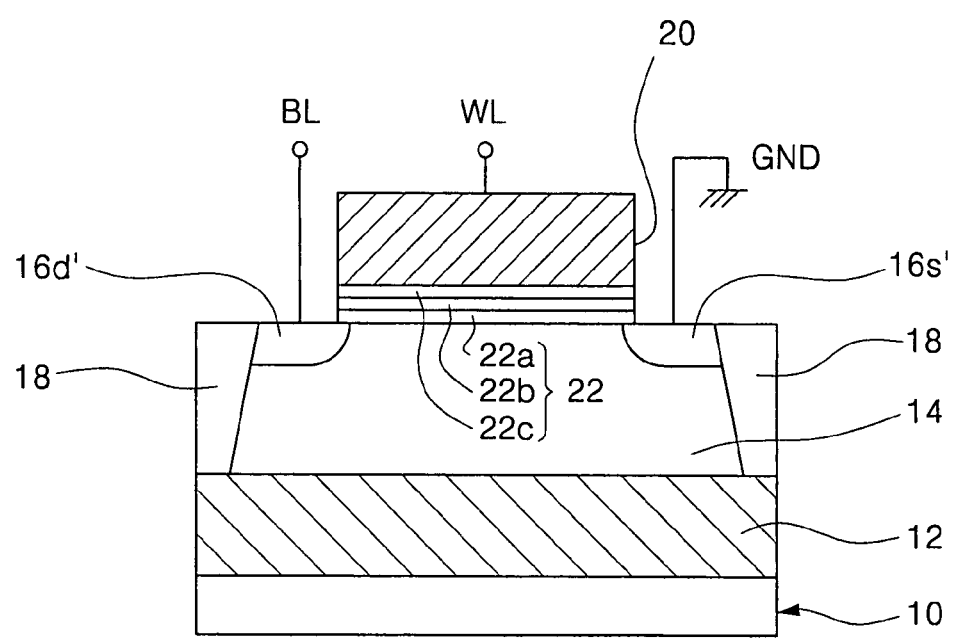
FIG. 4 illustrates a cross-sectional view of a semiconductor memory device in accordance with an exemplary embodiment of the present invention.

The source region 16s and the drain region 16d may be in contact with the buried oxide layer 12, as illustrated in FIG. 3. An isolation layer 18 may be on the semiconductor substrate 10. The isolation layer 18 may be in contact with the buried oxide layer 12, as illustrated in FIG. 4. In this case, a source region 16s' and a drain region 16d' may not be in contact with the buried oxide layer 12.

A gate electrode 20 may be on the floating body 14. The gate electrode 20 may be a conductive polysilicon layer. A charge storage region may be interposed between the floating body 14 and the gate electrode 20. The charge storage region may be a gate dielectric layer 22. In this case, the gate dielectric layer 22 may include a first silicon oxide layer 22a, a silicon nitride layer 22b deposited bon the first silicon oxide layer 22a, and a second silicon oxide layer 22c deposited on the silicon nitride layer 22b. The silicon nitride layer 22b may function as a trap dielectric layer. The charge storage region may be, e.g., a floating gate, a nanodot, a high-k dielectric layer, etc.

As illustrated in FIG. 3, the floating body 14 may be electrically isolated by the gate dielectric layer 22, the buried oxide layer 12, the source region 16s and the drain region 16d. As illustrated in FIG. 4, the floating body 14 may be electrically isolated by the gate dielectric layer 22, the buried oxide layer 12, the isolation layer 18, the source region 16s' and the drain region 16d'.

The semiconductor memory device in accordance with an embodiment of the present invention may store and read data using a floating body effect to operate in a DRAM cell mode. The semiconductor memory device in accordance with an embodiment of the present invention may store charges in the charge storage region or erase charges from the charge storage region to operate in a non-volatile memory cell mode. That is, the semiconductor memory device in accordance with an embodiment of the present invention may operate in the DRAM cell mode or the non-volatile memory cell mode.

Figure 2:
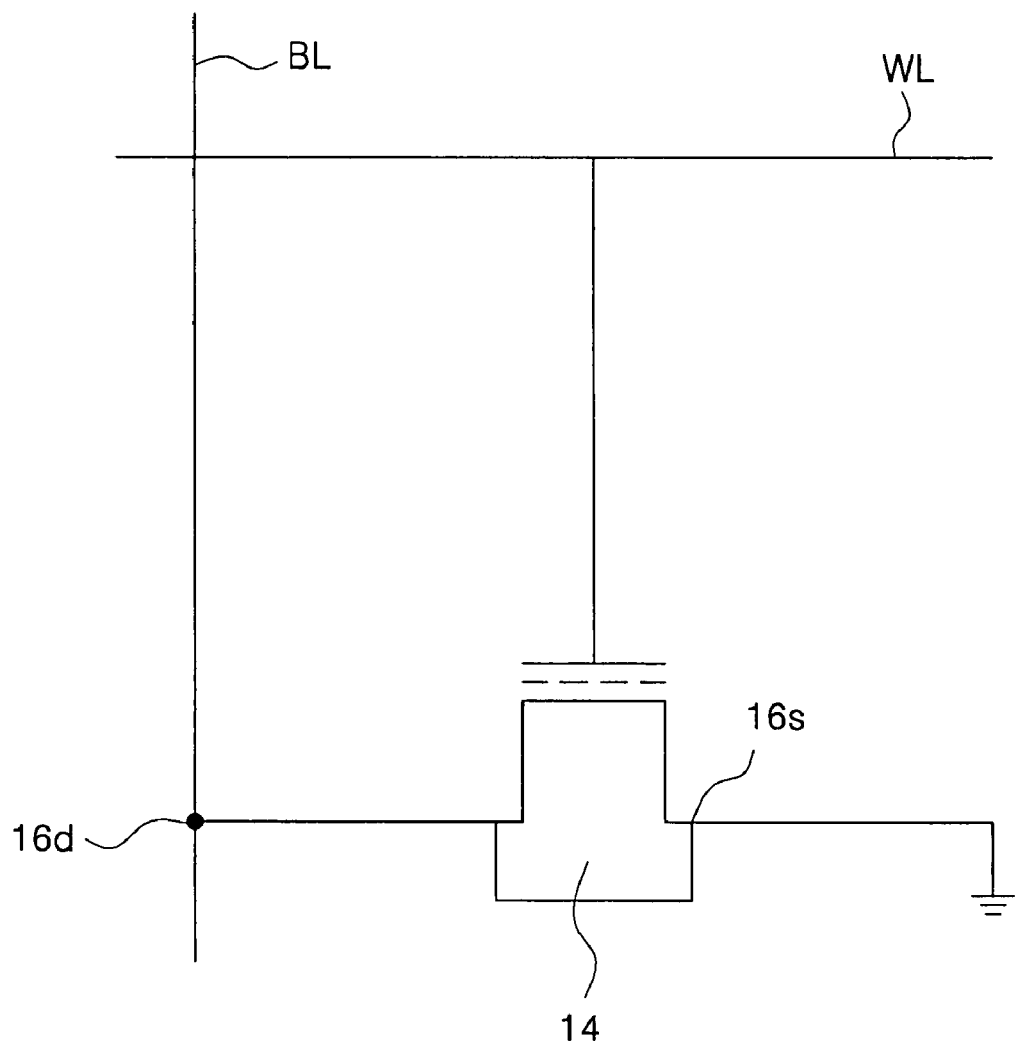
FIG. 2 illustrates a schematic equivalent circuit diagram of a method of operating a semiconductor memory device in accordance with the present invention.
Figure 5:
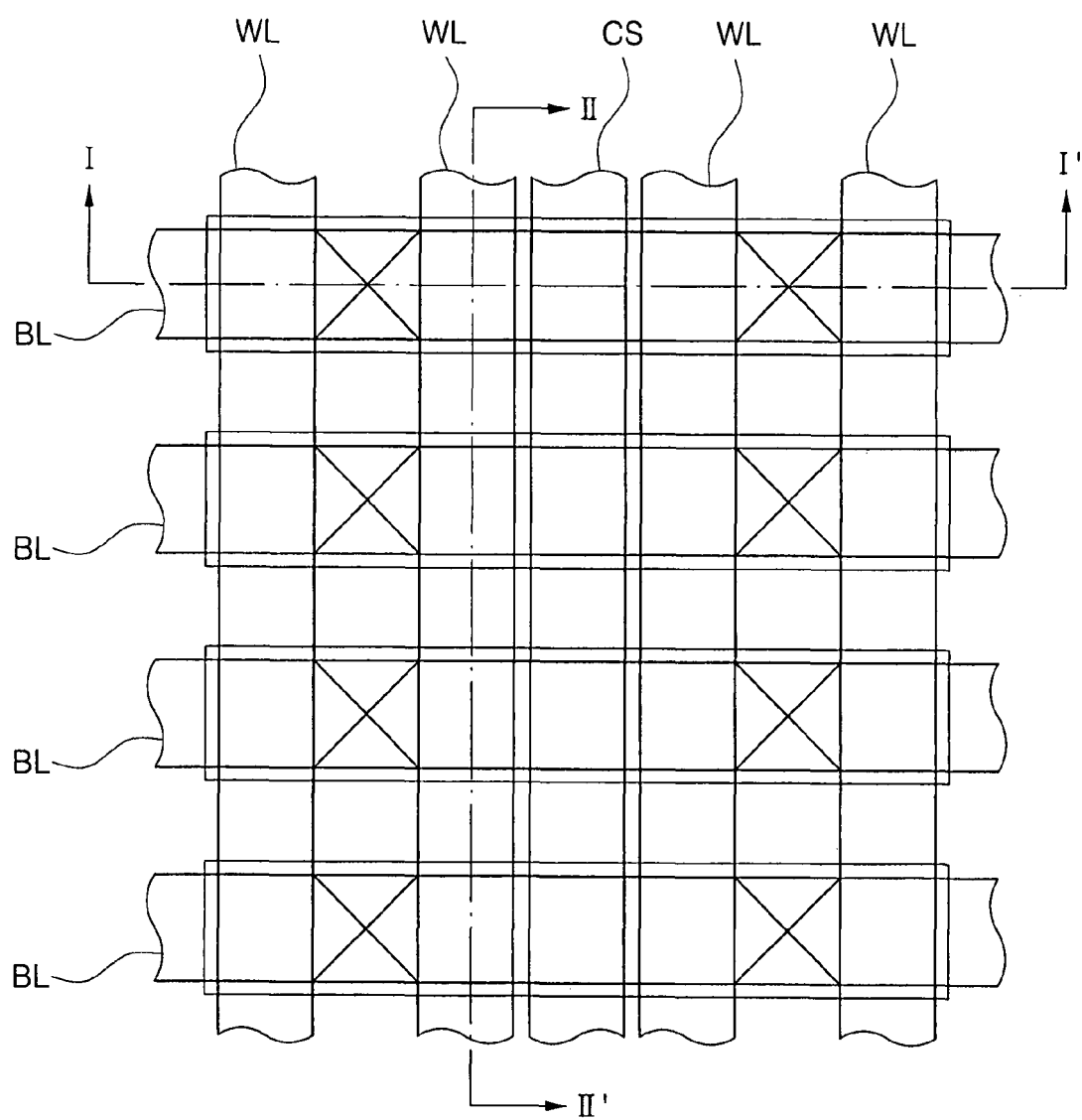
FIG. 5 illustrates a plan view of a semiconductor memory device in accordance with an exemplary embodiment of the present invention.
Figure 6:
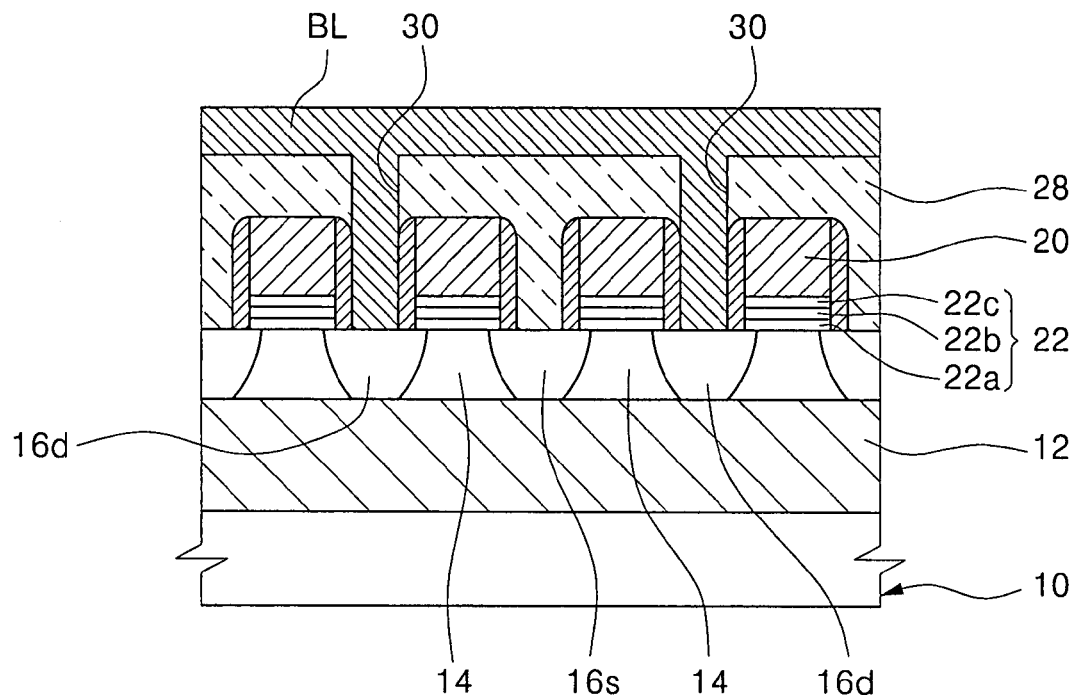
FIG. 6 illustrates a cross-sectional view taken along line I-I' of FIG. 5, of a semiconductor memory device in accordance with an exemplary embodiment of the present invention.
Figure 7:
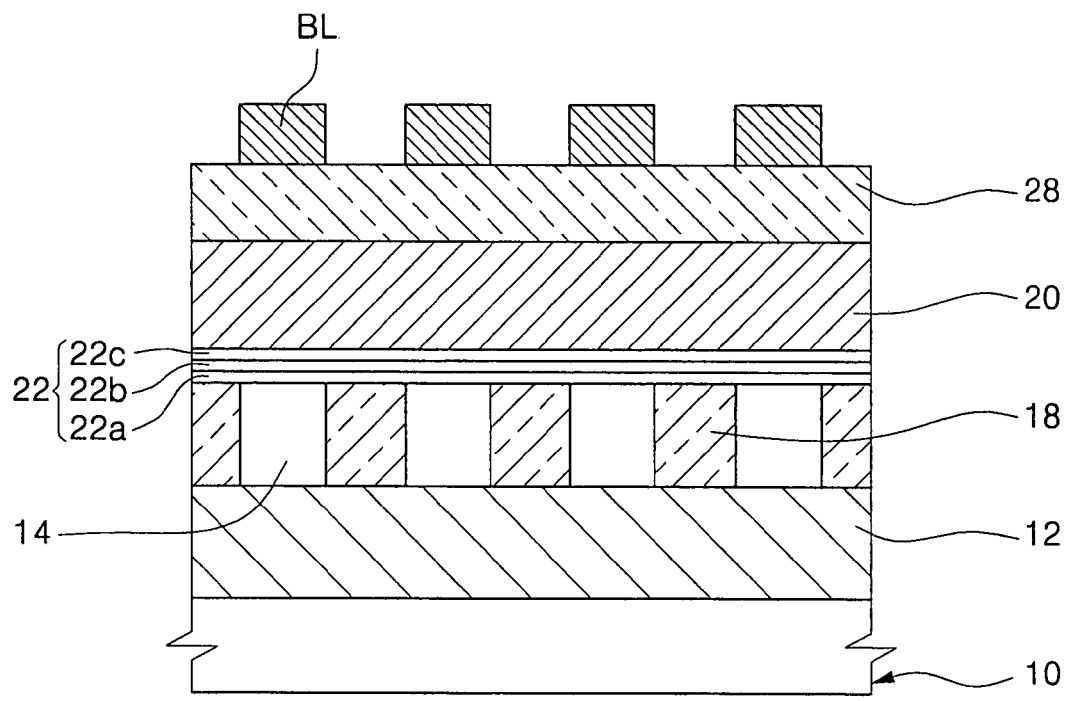
FIG. 7 illustrates a cross-sectional view taken along line II-II' of FIG. 5, of a semiconductor memory device in accordance with an exemplary embodiment of the present invention.

As illustrated in FIGS. 2 to 4, the source region 16s may be grounded, and the drain region 16d may be electrically connected to a bit line BL. The gate electrode 20 may be electrically connected to a word line WL. The bit line BL and the word line WL may be aligned to cross each other. In this case, among gate electrodes of multiple memory cells arranged in a matrix, gate electrodes may share a word line WL. Gate electrodes may share a first word line WL, and gate electrodes may share a second word line WL spaced apart from the first word line WL. In this case, as illustrated in FIG. 5, a common source line CS may be placed between the adjacent first and second word lines WL. Multiple source regions connected to the common source line CS may share the common source line CS. In addition, the common source line CS may be aligned in parallel with the word lines WL.

Figure 8:
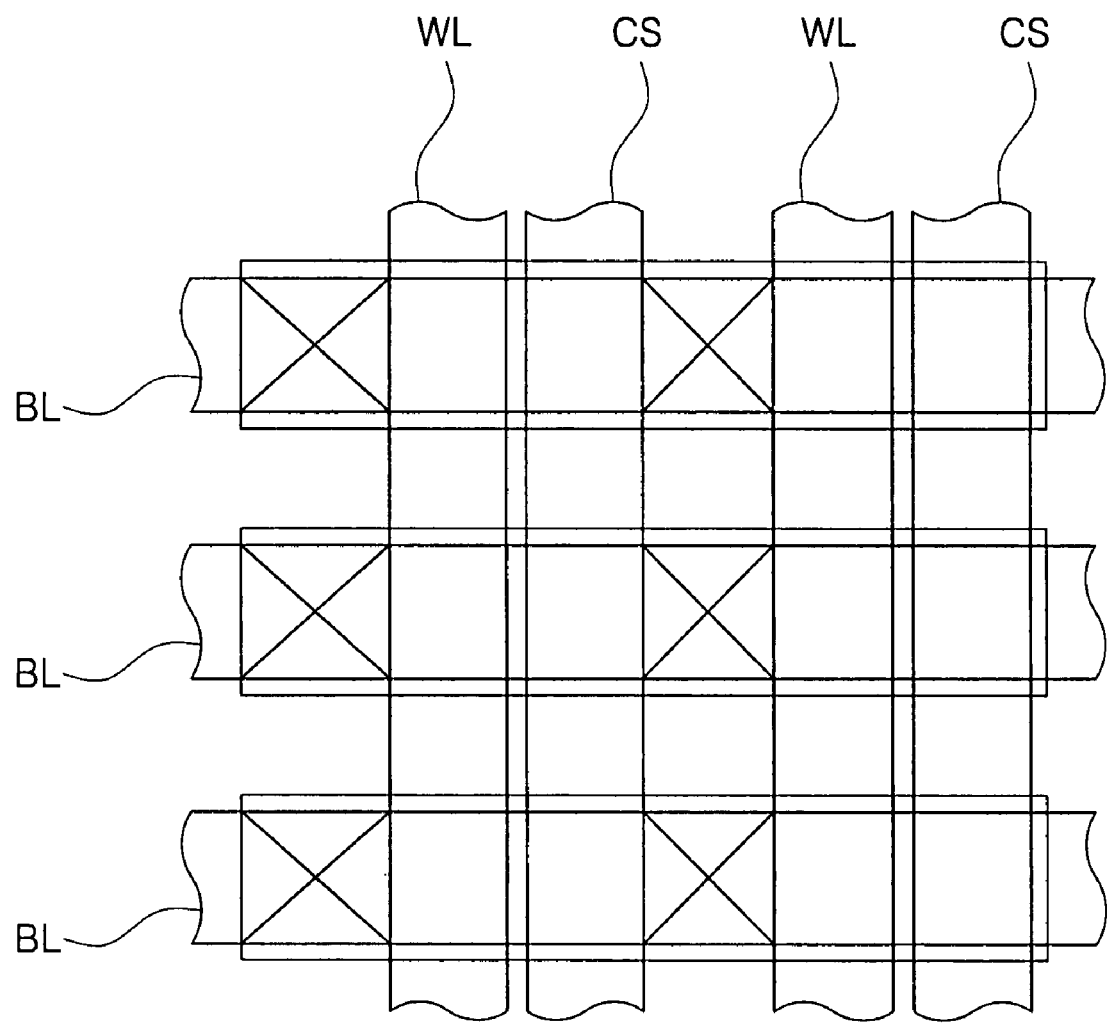
FIG. 8 illustrates a plan view of a semiconductor memory device in accordance with an exemplary embodiment of the present invention.

Alternatively, referring to FIG. 8, pairs of a word line WL with the source line CS may be repeatedly aligned in parallel with each other.

Hereafter, a semiconductor memory device in accordance with an embodiment of the present invention, operating in a DRAM cell mode, will be described.

The semiconductor memory device may include multiple memory cells arranged in an array. At least one memory cell may be selected from the memory cells. Then, an operation mode of the selected memory cell may be determined. The determination may include deciding whether the selected memory cell is to operate in the DRAM cell mode or the non-volatile memory cell mode, as illustrated in FIG. 1. A selection circuit may be employed to determine the operational mode. The selection circuit may include an inverter. The selection circuit may be a circuit peripheral to memory cells.

A write operation of the selected cell when the selected memory cell operates in the DRAM cell mode, i.e., a data program, operation will now be described.

The write operation may be performed using hot carrier injection (HCI). Specifically, the source region 16s may be grounded. A word line program voltage higher than a threshold voltage may be applied to the gate electrode 20. A bit line program voltage may be applied to the drain region 16d. In this case, the word line program voltage may be about 5V, and the bit line program voltage may be about 2V.

The write operation may generate carrier pairs in the floating body 14 adjacent to the drain region 16d. The carrier pairs may include electrons and holes. The electrons may be erased in the source region 16s and the drain region 16d. On the other hand, the holes may accumulate in the floating body 14. The accumulated holes may increase the electric potential of the floating body 14. The threshold voltage may thus be lowered due to the increased electric potential of the floating body 14.

Alternatively, the write operation may be performed using band-to-band tunneling. A negative word line program voltage may be applied to the gate electrode 20. A positive program voltage may be applied to the source region 16s and the drain region 16d. As a result, carrier pairs may be generated in the floating body 14 adjacent to the source region 16s and the drain region 16d. The carrier pairs may include electrons and holes. The electrons may be erased through the source region 16s and the drain region 16d. On the other hand, the holes may accumulate in the floating body 14. The accumulated holes may increase the electric potential of the floating body 14. The threshold voltage may thus be lowered due to the increased electric potential of the floating body 14.

The erase operation may use tunneling. When using tunneling, the source region 16s may be grounded. A positive word line erase voltage may be applied to the gate electrode 20, and a negative bit line erase voltage may be applied to the drain region 16d. Alternatively, a negative voltage may be applied to the source region 16s and the drain region 16d, and the gate electrode 20 may be floated. In this case, the negative voltage applied to the source region 16s and the drain region 16d may be about −2V, respectively. When the voltage applied to the source region 16s is about 0V, the voltage applied to the drain region 16d may be about −2V.

The erase operation may allow the accumulated holes to be erased through the drain region 16d. The erase operation may permit a relative reduction the electric potential of the floating body 14. The threshold voltage may relatively increase due to the reduced electric potential of the floating body 14.

A read operation of a semiconductor memory device operating in the DRAM cell mode will now be described.

The read operation may include grounding the source region 16s. A word line read voltage lower than the word line program voltage may be applied to the gate electrode 20. A bit line read voltage lower than the bit line program voltage may be applied to the drain region 16d. The read operation may allow drain current to flow through the floating body 14. The drain current may vary depending on the amount of the accumulated holes in the floating body 14. When the accumulated holes reside in the floating body 14, the drain current may flow during the read operation. In contrast, when accumulated holes do not reside in the floating body 14, a relatively small amount of drain current may flow during the read operation. Data stored in the selected memory cell may be read by sensing the drain current.

As described above, when the semiconductor memory device operates in a DRAM cell mode, there may be no need for the conventional capacitor. Therefore, since there is no need to provide a region for a capacitor, it may be possible to improve the integration density of the semiconductor device.

A write operation of the selected memory cell when the selected memory cell operates in a non-volatile memory cell mode, i.e., a data program operation, will now be described.

A program operation of a semiconductor memory device operating in a non-volatile memory cell mode may use channel hot electron injection (CHEI). In order to induce the CHEI, a word line program voltage may be applied to the gate electrode 20, and a bit line program voltage may be applied to the drain region 16d. In this case, the source region 16s may be grounded. The word line program voltage may be about 10V, and the bit line program voltage may be about 5V. A strong lateral electric field may thus be generated between the source region 16s and the drain region 16d. As a result, hot electrons may be generated in a channel region adjacent to the drain region 16d. The hot electrons may be injected into an interface between the first silicon oxide layer 22a and the silicon nitride layer 22b, or the hot electrons may be injected into the silicon nitride layer 22b beyond an energy barrier of the floating body 14 and the first silicon oxide layer 22a. The injected hot electrons may increase the threshold voltage of the selected memory cell. Therefore, when a voltage lower than the increased threshold voltage is applied to the gate electrode 20, there may be no current flowing through the programmed memory cell. As a result, it may be possible to read the stored information.

An erase operation of the selected memory cell may use hot hole injection (HHI). In this case, the source region 16*s* and the drain region 16*d* may be grounded. A negative word line erase voltage may be applied to the gate electrode 20. The word line erase voltage may be about −8V. Hot holes generated between the source region 16*s* and the floating body 14, or between the drain region 16*d* and the floating body 14, may be injected into an interface between the first silicon oxide layer 22*a* and the silicon nitride layer 22*b*, or into the silicon nitride layer 22*b*, to perform the erase operation.

As described above, the semiconductor memory device in accordance with the present invention may operate in a DRAM cell mode or a non-volatile memory cell mode depending on the selection operation using the selection circuit.

Figure 9:
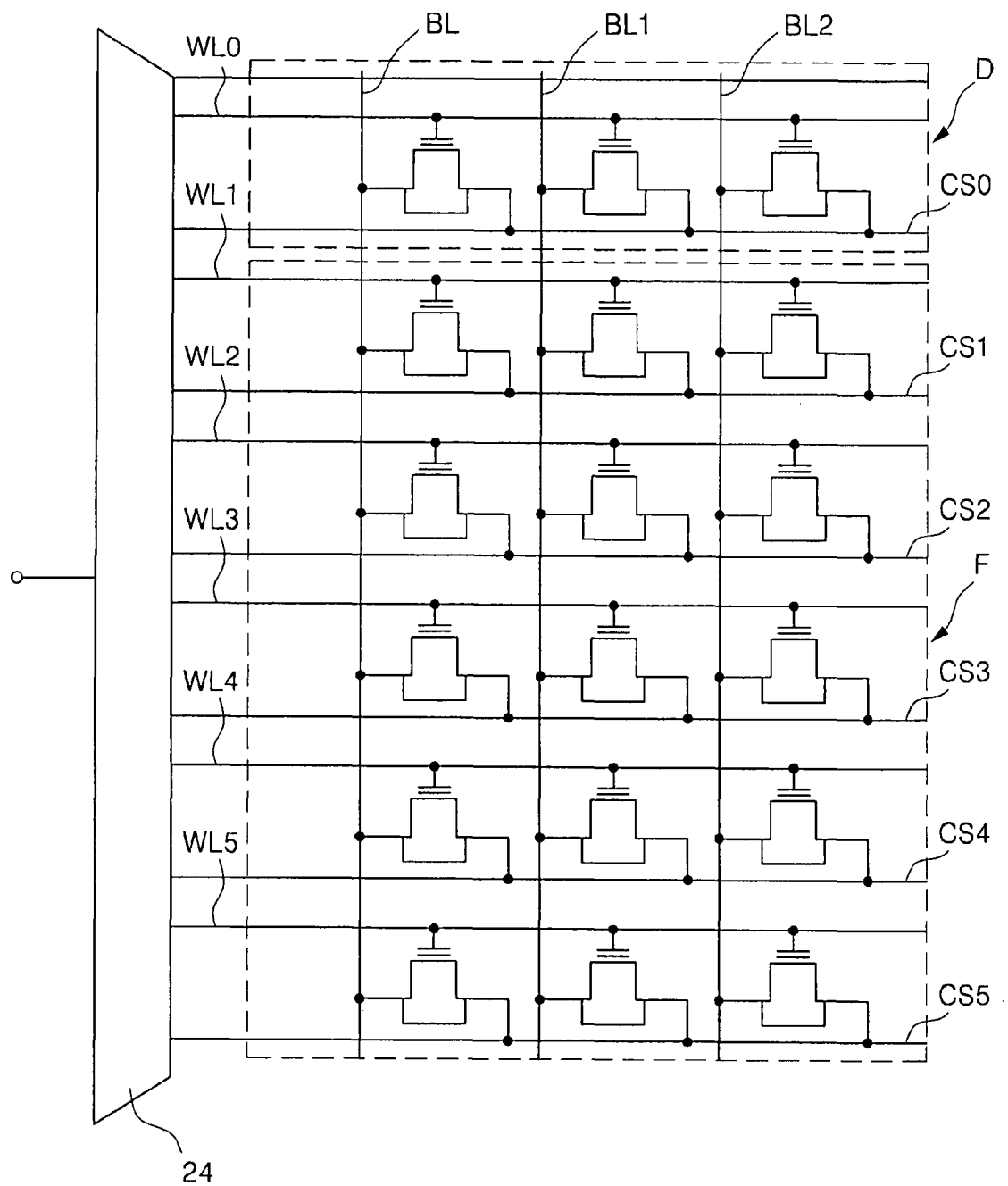
FIG. 9 illustrates a schematic view of a memory cell array of a semiconductor memory device in accordance with an exemplary embodiment of the present invention.

Referring to FIG. 9, a memory cell layout, in which a semiconductor memory device is arranged, may be divided into a region D operating in a DRAM cell mode and a region F operating in a non-volatile memory cell mode by the selection circuit part 24. Word lines Wl0, WL1 . . . WL5 and common source lines CS0, CS1 . . . CS5 may be arranged to be substantially parallel. Bit lines BL, BL1, BL2 may be arranged to cross the word lines W10, WL1 . . . WL5 and the common source lines CS0, CS1 . . . CS5.

A method of manufacturing the semiconductor memory device in accordance with an embodiment of the present invention will now be described.

Referring to FIGS. 5 to 8, the buried insulating layer 12 may be formed on the semiconductor substrate 10. The buried insulating layer 12 may be a high-concentration impurity region. A silicon layer may be formed on the buried insulating layer 12. The isolation layer 18 may be formed on the substrate having the silicon layer. The isolation layer 18 may be formed of, e.g., silicon oxide.

Gate electrodes 20 may be formed on the silicon layer spaced apart from each other. In this case, the gate dielectric layer 22 may be formed between the gate electrodes 20 and the silicon layer. The gate dielectric layer 22 may be formed of, e.g., the first silicon oxide layer 22*a*, the silicon nitride layer 22*b*, and the second silicon oxide layer 22*c*, which are sequentially stacked.

Source and drain regions 16*s* and 16*d* may be formed in a silicon layer at both sides of each of the gate electrodes 20 using the gate electrodes 20 as an ion implantation mask. In this case, the source and drain regions 16*s* and 16*d* may be formed in contact with the buried insulating layer 12. The silicon layer may form a floating body 14 electrically isolated by the buried insulating layer 12, the source region 16*s* and the drain region 16*d*, and the gate dielectric layer 22. An interlayer insulating layer 28 may be formed on the entire surface of the substrate having the gate electrodes 20. The interlayer insulating layer 28 may be patterned to form openings 30 exposing the drain regions 16*d*. A conductive layer may be formed on the substrate having the openings. The conductive layer may be patterned to form bit lines BL electrically connected to the drain regions 16*d*.

Meanwhile, the semiconductor memory device according to an embodiment of the present invention may be a memory device having a vertical channel transistor structure.

Figure 10:
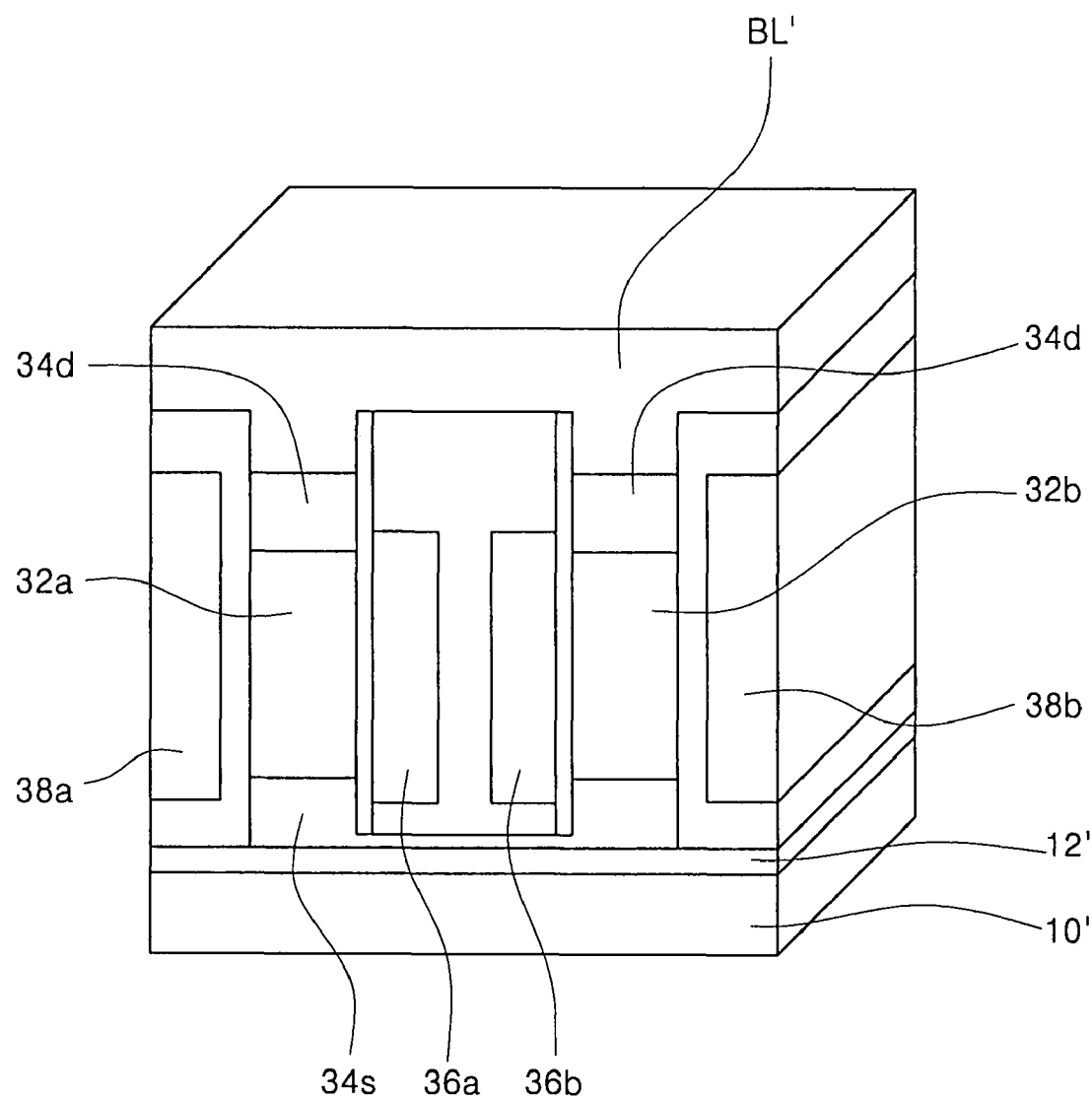
FIG. 10 illustrates a perspective view of a semiconductor memory device in accordance with an exemplary embodiment of the present invention.
Figure 11:
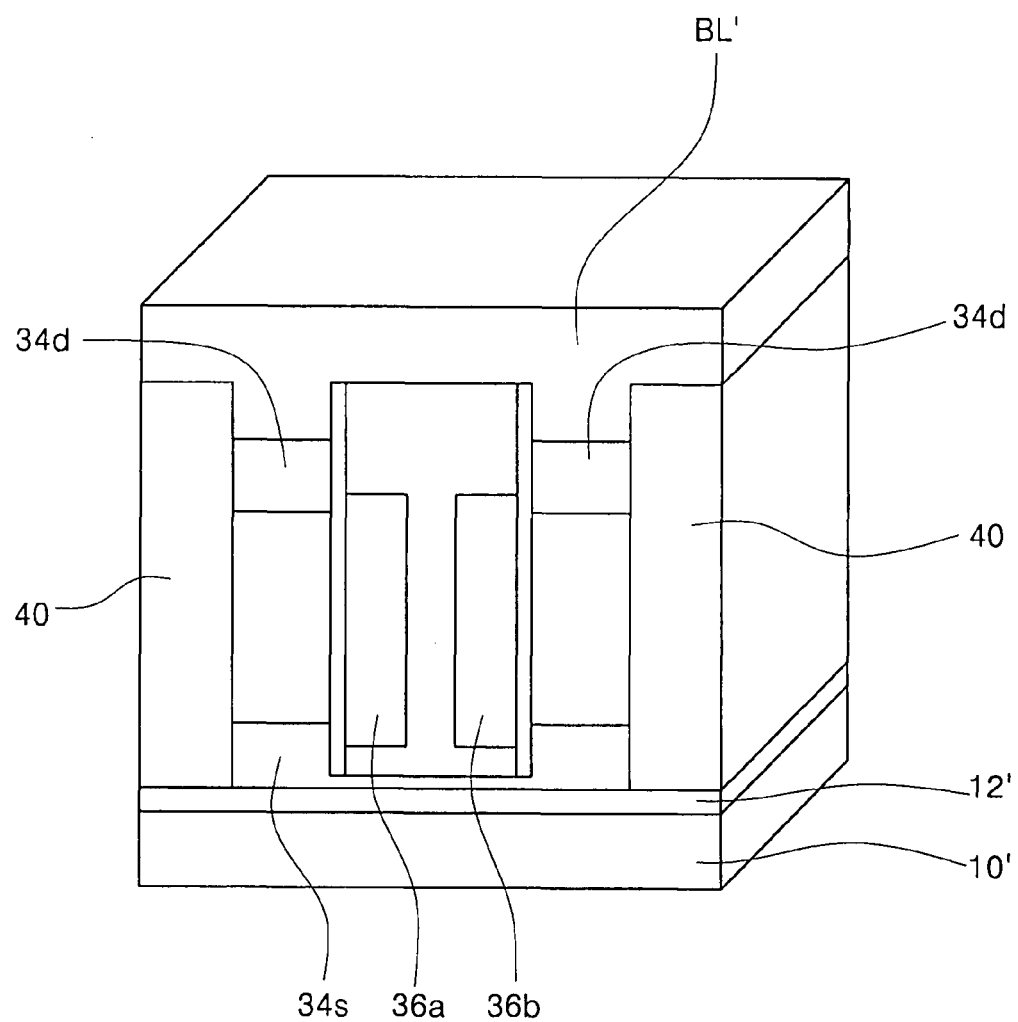
FIG. 11 illustrates a perspective view of a semiconductor memory device in accordance with an exemplary embodiment of the present invention.

Referring to FIGS. 10 and 11, when the semiconductor memory device has a vertical channel transistor structure, each of the floating bodies described above may include first and second floating bodies 32*a* and 32*b* spaced apart from each other. In addition, source and drain regions 34*s* and 34*d* may be disposed under and on the first and second floating bodies 32*a* and 32*b*, and gate electrodes 36*a* and 36*b* may be between the first and second floating bodies 32*a* and 32*b*. In this case, the gate electrodes 36*a* and 36*b* may be on a substrate 10' having a buried insulating layer 12'. In addition, the drain regions 34*d* may be electrically connected to a bit line BL'.

The semiconductor memory device may further include back gate electrodes 38*a* and 38*b* covering first sidewalls of the first and second floating bodies 32*a* and 32*b*. In addition, the gate electrodes 36*a* and 36*b* may cover second sidewalls of the first and second floating bodies 32*a* and 32*b*, different from the first sidewalls. An isolation layer 40 may be utilized instead of the back gate electrodes 38*a* and 38*b*. The gate dielectric layer may be interposed between the gate electrodes 36*a* and 36*b* and the floating bodies 32*a* and 32*b*.

As can be seen from the foregoing, since a semiconductor memory device in accordance with the present invention may operate in a DRAM cell mode and a non-volatile memory cell mode, without a capacitor, it may be possible to frequently rewrite data, and maintain the written data for an extended time period. In addition, since there is no need for a capacitor, it may be possible to increase integration density of the semiconductor memory device.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
  a plurality of transistors arranged in an array on a semiconductor substrate, the transistors having floating bodies;
  word lines connected to gate electrodes of the transistors;
  bit lines connected to drains of the transistors at a first side of the gate electrodes;
  source lines connected to sources of the transistors at a second side of the gate electrodes different from the first side of the gate electrodes;
  charge storage regions between the gate electrodes and the floating bodies; and
  each of the floating bodies includes first and second floating bodies spaced apart from each other, the sources and drains being respectively under and on the first and second floating bodies, and the gate electrodes being between the first and second floating bodies.

2. The semiconductor memory device as claimed in claim 1, wherein each of the charge storage regions includes a dielectric layer.

3. The semiconductor memory device as claimed in claim 2, wherein the dielectric layer includes a first silicon oxide layer, a silicon nitride layer on the first silicon oxide layer, and a second silicon oxide layer on the silicon nitride layer.

4. The semiconductor memory device as claimed in claim 1, further comprising:
  gate insulating layers between the floating bodies and the gate electrodes, and a buried insulating layer on the semiconductor substrate,
  wherein each of the floating bodies is electrically isolated by the gate insulating layer, the buried insulating layer, the source, and the drain.

5. The semiconductor memory device as claimed in claim 1, further comprising:

gate insulating layers between the floating bodies and the gate electrodes;
a buried insulating layer on the semiconductor substrate; and
an isolation layer surrounding sidewalls of the floating body, wherein each of the floating bodies is electrically isolated by the gate insulating layer, the buried insulating layer, the isolation layer, the source, and the drain.

6. The semiconductor memory device as claimed in claim 1, wherein the source line is a common source line connected to sources of adjacent transistors.

7. The semiconductor memory device as claimed in claim 1, wherein the gate electrodes are on the floating bodies, and the sources and drains are at both sides of the floating bodies.

8. The semiconductor memory device as claimed in claim 1, wherein the gate electrodes extend from their one ends to cross over the first and second floating bodies.

9. The semiconductor memory device as claimed in claim 1, further comprising:
back gate electrodes covering first sidewalls of the first and second floating bodies, wherein the gate electrodes include first and second gate electrodes insulated from each other, and the first and second gate electrodes cover second sidewalls of the first and second floating bodies, different from the first sidewalls.

10. The semiconductor memory device as claimed in claim 1, wherein each transistor in the array defines a memory cell, the device further comprising a selection circuit adapted to select at least one cell of the memory cells, to determine whether the selected cell is to operate in a DRAM cell mode or a non-volatile memory cell mode, and to operate the selected cell in the DRAM cell mode or the non-volatile memory cell mode in accordance with the determination.

11. The semiconductor memory device as claimed in claim 10, wherein, during operation of the selected cell in the DRAM cell mode, the selection circuit is adapted to:
apply a gate voltage to a gate electrode of the selected cell, gate electrodes of memory cells sharing a word line with the selected cell;
apply a drain voltage to a drain of the selected cell, drain electrodes of memory cells sharing a bit line with the selected cell; and
apply a source voltage lower than the drain voltage to a source of the selected cell, sources of memory cells sharing a source line with the selected cell to accumulate holes in the floating bodies.

12. The semiconductor memory device as claimed in claim 11, wherein the gate voltage is about 5V, the drain voltage is about 2V, and the source voltage is about 0V.

13. The semiconductor memory device as claimed in claim 10, wherein, during operation of the selected cell in the DRAM cell mode, the selection circuit is adapted to:
float a gate electrode of the selected cell, gate electrodes of memory cells sharing a word line with the selected cell;
apply a negative drain voltage to a drain of the selected cell, drains of memory cells sharing a bit line with the selected cell; and
apply a source voltage to a source of the selected cell, sources of memory cells sharing a source line with the selected cell to erase holes in the floating bodies.

14. The semiconductor memory device as claimed in claim 13, wherein the negative drain voltage is about −2V, and the source voltage is about 0V.

15. The semiconductor memory device as claimed in claim 10, wherein, during operation of the selected cell in the non-volatile memory cell mode, the selection circuit is adapted to:
apply a gate voltage to a gate electrode of the selected cell, gate electrodes of memory cells sharing a word line with the selected cell;
apply a drain voltage to a drain of the selected cell, drains of memory cells sharing a bit line with the selected cell; and
apply a source voltage lower than the drain voltage to a source of the selected cell, sources of memory cells sharing a source line with the selected cell to store charges in the charge storage regions.

16. The semiconductor memory device as claimed in claim 15, wherein the gate voltage is about 10V, the drain voltage is about 5V, and the source voltage is about 0V.

17. The semiconductor memory device as claimed in claim 10, wherein, during operation of the selected cell in the non-volatile memory cell mode, the selection circuit is adapted to:
apply a negative gate voltage to a gate electrode of the selected cell, and gate electrodes of memory cells sharing a word line with the selected cell;
float a drain of the selected cell, and drains of memory cells sharing a bit line with the selected cell; and
apply a source voltage to a source of the selected cell, and sources of memory cells sharing a source line with the selected cell to erase charges in the charge storage regions.

18. The semiconductor memory device as claimed in claim 17, wherein the negative gate voltage is about −8V, and the source voltage is about 0V.

* * * * *